United States Patent
Wortman

[19]

[11] Patent Number: 5,942,334
[45] Date of Patent: Aug. 24, 1999

[54] MULTILAYER THERMAL BARRIER COATING

[75] Inventor: David J. Wortman, Hamilton, Ohio

[73] Assignee: General Electric Company, Cincinnati, Ohio

[21] Appl. No.: 09/046,733

[22] Filed: Mar. 24, 1998

Related U.S. Application Data

[62] Division of application No. 08/572,214, Apr. 18, 1996, Pat. No. 5,792,521.

[51] Int. Cl.$^6$ .................................................... B32B 15/00
[52] U.S. Cl. ........................ 428/469; 428/472; 428/699; 428/701; 428/702
[58] Field of Search .................................... 428/469, 472, 428/701, 702, 699

[56] References Cited

U.S. PATENT DOCUMENTS

| | | | |
|---|---|---|---|
| 3,205,087 | 9/1965 | Allen | 117/37 |
| 3,432,335 | 3/1969 | Schiller et al. | 117/106 |
| 3,655,430 | 4/1972 | Greaves | 117/107 |
| 3,673,006 | 6/1972 | Plumat et al. | 117/106 |
| 4,112,137 | 9/1978 | Zega | 427/38 |
| 4,230,739 | 10/1980 | Aichert et al. | 427/42 |
| 4,237,148 | 12/1980 | Aichert et al. | 427/42 |
| 4,321,311 | 3/1982 | Strangman | 428/623 |
| 4,414,249 | 11/1983 | Ulion et al. | 427/248.1 |
| 4,632,059 | 12/1986 | Flatscher et al | 118/727 |
| 4,676,994 | 6/1987 | Demaray | 427/42 |
| 5,015,502 | 5/1991 | Strangman et al. | 427/248.1 |
| 5,122,389 | 6/1992 | Yasunaga | 427/42 |
| 5,514,482 | 5/1996 | Strangman | 427/554 |
| 5,538,796 | 7/1996 | Schaffer et al. | 428/469 |
| 5,652,044 | 7/1997 | Rickerby | 428/216 |
| 5,792,521 | 8/1998 | Wortman | 427/567 |

*Primary Examiner*—Timothy M. Speer
*Attorney, Agent, or Firm*—Andrew C. Hess; David L. Narciso

[57] ABSTRACT

A method for forming a multilayer thermal barrier coating by physical vapor deposition such that the individual layers of the coating are substantially homogeneous. As a result, a distinct compositional interface is formed between adjacent layers when different ceramic materials are employed to form alternating layers of the coating. Preferably, different ceramic materials characterized by differing thermal conductivities and resistance to erosion are employed, such that both the wear and adhesion characteristics of the coating are promoted. The method entails supporting an article in proximity to ceramic ingots of the preferred ceramic materials, and then sequentially deflecting an electron beam at the ingots so as to melt a portion of each ingot and produce a vapor of each ceramic material that deposits onto the article. According to a particular aspect of this invention, the electron beam is deflected between the members so as to establish a minimum duration during which vapor is not produced from any of the ingots.

8 Claims, 2 Drawing Sheets

MULTILAYER THERMAL BARRIER COATING

This is a division of patent application Ser. No. 08/572,214, filed Apr. 18, 1996, now U.S. Pat. No. 5,792,521.

This invention relates to thermal barrier coatings for components exposed to high temperatures, such as the hostile thermal environment of a gas turbine engine. More particularly, this invention is directed to a method for forming a multilayer thermal barrier coating composed of different ceramic coating materials that are separately and sequentially deposited to form discrete and homogeneous layers, such that a distinct compositional interface is formed between each adjacent pair of the successive layers.

BACKGROUND OF THE INVENTION

Higher operating temperatures of gas turbine engines are continuously sought in order to increase their efficiency. However, as operating temperatures increase, the high temperature durability of the components of the engine must correspondingly increase. Significant advances in high temperature capabilities have been achieved through the formulation of nickel and cobalt-base superalloys, though such alloys alone are often inadequate to form components located in certain sections of a gas turbine engine, such as the turbine, combustor and augmentor. A common solution is to thermally insulate such components in order to minimize their service temperatures. For this purpose, thermal barrier coatings (TBC) formed on the exposed surfaces of high temperature components have found wide use.

To be effective, thermal barrier coatings must have low thermal conductivity, capable of being strongly adhered to the article, and remain adherent through many heating and cooling cycles. The latter requirement is particular demanding due to the different coefficients of thermal expansion between materials having low thermal conductivity and superalloy materials used to form turbine engine components. For this reason, thermal barrier coatings have generally employed a metallic bond layer deposited on the surface of a superalloy component, followed by an adherent ceramic layer that serves to thermally insulate the component, which together form what is termed a thermal barrier coating system. The metallic bond layer is formed from an oxidation-resistant alloy, such as MCrAlY where M is iron, cobalt and/or nickel, and promotes the adhesion of the ceramic layer to the component while also preventing oxidation of the underlying superalloy. Various ceramic materials have been employed as the ceramic layer, particularly zirconia ($ZrO_2$) stabilized by yttria ($Y_2O_3$), magnesia (MgO) or another oxide. These particular materials are widely employed in the art because they can be readily deposited by plasma spray, flame spray and vapor deposition techniques, and are reflective to infrared radiation so as to minimize the absorption of radiated heat by the coated component.

A continuing challenge of thermal barrier coating systems has been the formation of a more adherent ceramic layer that is less susceptible to spalling when subjected to thermal cycling. For this purpose, the prior art has proposed various coating systems, with considerable emphasis on ceramic layers having enhanced strain tolerance as a result of the presence of porosity, microcracks and segmentation of the ceramic layer. Microcracks generally denote random internal discontinuities within the ceramic layer, while segmentation indicates that the ceramic layer has a columnar grain structure oriented perpendicularly to the surface of the component, such that microcracks are present between grains. As is known in the art, a thermal barrier coating having a columnar grain structure is able to expand without causing damaging stresses that lead to spallation, as evidenced by thermal cyclic testing.

Zirconia-base thermal barrier coatings, and particularly yttria-stabilized zirconia (YSZ) coatings having columnar grain structures and a thickness on the order of about 125 micrometers (about 0.005 inch) or more, are widely employed in the art for their desirable thermal and adhesion characteristics. However, YSZ coatings are susceptible to erosion from particles and debris present in the high velocity gas stream of a gas turbine engine. Though a solution to a high erosion rate is to increase the thickness of a thermal barrier coating, a drawback is an increase in thermal stresses within the coating, leading to a higher incidence of spallation. Consequently, there is a need for erosion-resistant thermal barrier coating systems having minimal thicknesses, preferably less than 125 micrometers.

Attempts to produce erosion-resistant thermal barrier coating systems for high temperature applications in a gas turbine engine have been directed to thermally treating the outer surface of the ceramic material or providing an additional wear-resistant outer coating to promote the erosion resistance of the coating system. More wear-resistant outer coating materials suggested in the past have included zircon ($ZrSiO_4$), silica ($SiO_2$), chromia ($Cr_2O_3$) and alumina ($Al_2O_3$). While various methods and apparatuses have been suggested that are capable of depositing layers of different materials, as evidenced by U.S. Pat. No. 3,205,087 to Allen and U.S. Pat. No. 4,632,059 to Flatscher et al., difficulty has been encountered when attempting to sequentially deposit discrete and homogeneous layers. In particular, compositional gradients tend to form between successively deposited layers, which generally increases the thermal conductivity of the thermal barrier coating.

Attempts have also been made using multilayer systems (microlaminates) to reduce the thermal conductivity of thermal barrier coatings in order to allow use of thinner coatings. Approaches have included YSZ and alumina as the alternating materials, such that the interfaces between layers help to inhibit the transfer of heat. As noted above, prior art processes have not reliably achieved the sharp compositional gradients required to have the desired effect of lowering thermal conductivity.

The desire to reduce thermal stresses by minimizing the thickness of the overall thermal barrier coating further complicates the process by which such thermal barrier coatings are formed. Though it is possible to employ low deposition rates, as taught by Allen and inherent with the teachings of Flatscher et al., and physically reposition a component to be coated in order to ensure that discrete and homogeneous layers are deposited, such a technique is impractical for coating mass-produced components such as turbine blades and vanes of a gas turbine engine.

Accordingly, what is needed is a method for forming a multilayer thermal barrier coating system characterized by lower thermal conductivity and enhanced resistance to spallation when subjected to erosion in a hostile thermal environment, in which the method is particularly well suited for use in mass production.

SUMMARY OF THE INVENTION

It is an object of this invention to provide a method for forming a thermal barrier coating for an article exposed to erosion in a hostile thermal environment.

It is another object of this invention that the thermal barrier coating is composed of multiple layers of thermal insulating materials, some of which serve to particularly promote the erosion resistance of the coating while others promote a low thermal conductivity for the coating.

It is a further object of this invention that the method is capable of rapidly and sequentially depositing discrete homogeneous layers, such that a distinct compositional interface is formed between the layers.

It is yet another object of this invention that the method is capable of rapidly depositing the multiple layers in a manner that maximizes the number of individual layers while minimizing the thickness of the thermal barrier coating.

The present invention makes possible a thermal barrier coating which is adapted to be formed on an article subjected to a hostile thermal environment while subjected to erosion by particles and debris, as is the case with turbine, combustor and augmentor components of a gas turbine engine. The thermal barrier coating is composed of multiple layers of different ceramic materials characterized by differing thermal conductivities and resistance to erosion. Ceramic materials characterized by lower thermal conductivity serve to render the article more resistant to a hostile thermal environment, while ceramic materials characterized by greater resistance to erosion promote the service life of the coating. Suitable erosion-resistant ceramic materials include alumina ($Al_2O_3$), while a preferred thermal-insulating ceramic material is yttria-stabilized zirconia having a columnar grain structure.

According to the present invention, the multiple layers are sequentially deposited by physical vapor deposition (PVD) in such a manner that the individual layers are substantially homogeneous, and a distinct compositional interface is formed between adjacent layers. Furthermore, the method by which the layers are deposited is capable of rapidly depositing the multiple layers in a manner that maximizes the number of individual layers while minimizing the thickness of the thermal barrier coating, yet yields a thermal barrier coating characterized by low thermal conductivity due to avoidance of intermixing between individual layers.

The method of this invention generally entails supporting an article in proximity to members of the different ceramic coating materials within a vessel that is at least partially evacuated. An electron beam is then sequentially deflected at the members so as to melt the surface of each of the members and produce a vapor of each of the different ceramic coating materials that deposits onto the article. According to a particular aspect of this invention, the electron beam is deflected between the members so as to establish a duration during which vapor is not produced from any of the members. As such, the vapors of the different ceramic coating materials do not coexist within the vessel. Furthermore, the duration for which the electron beam is deflected at each of the members is sufficient to maintain the surface of each member molten, so as to eliminate the requirement to remelt the members during each cycle.

In the above manner, each of the different ceramic coating materials is deposited to form a discrete and homogeneous successive layer on the article, such that a distinct compositional interface is formed between successive layers. As such, the thermal and adhesion characteristics of the coating system are not degraded by intermixing of the ceramic materials, as has been the tendency with prior art attempts to deposit multiple layers of different ceramic materials. In addition, thermal barrier coating systems having thicknesses of less than one hundred micrometers, composed of individual layers of less than one micrometer thick, are readily deposited, resulting in a coating system capable of exhibiting improved erosion resistance as compared to columnar YSZ ceramic coatings of significantly greater thicknesses. Such an improvement is particularly advantageous because adhesion and thermal cycle resistance are generally promoted with the use of a thinner coating system. Furthermore, coating rates attained by the method of this invention can approach that for depositing a single ceramic material.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

The present invention is generally directed to a method for depositing a thermal barrier coating on a metal component intended for operation within an environment characterized by high temperatures, in which the component is subjected to a combination of thermal stresses and erosion by particles and debris. Notable examples of such components include the high and low pressure turbine nozzles and blades, shrouds, combustor liners and augmentor hardware of gas turbine engines. While the advantages of this invention will be illustrated and described with reference to a turbine blade of a gas turbine engine, the teachings of this invention are generally applicable to any component in which a thermal barrier coating can be used to insulate the component from a hostile thermal environment.

Figure 1:
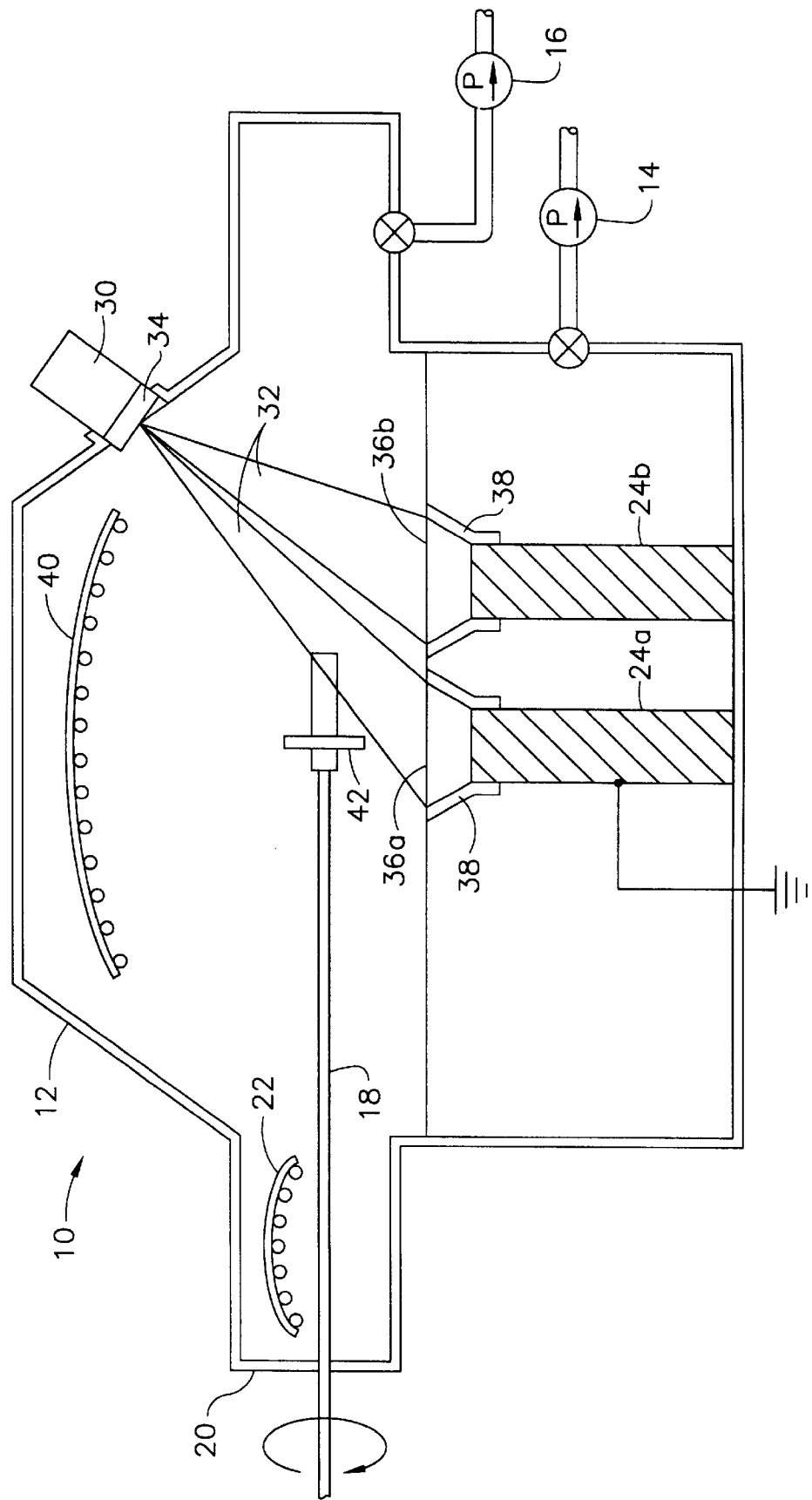
FIG. 1 shows a schematic representation of a physical vapor deposition apparatus used to deposit a multilayer thermal barrier coating system in accordance with this invention.
Figure 2:
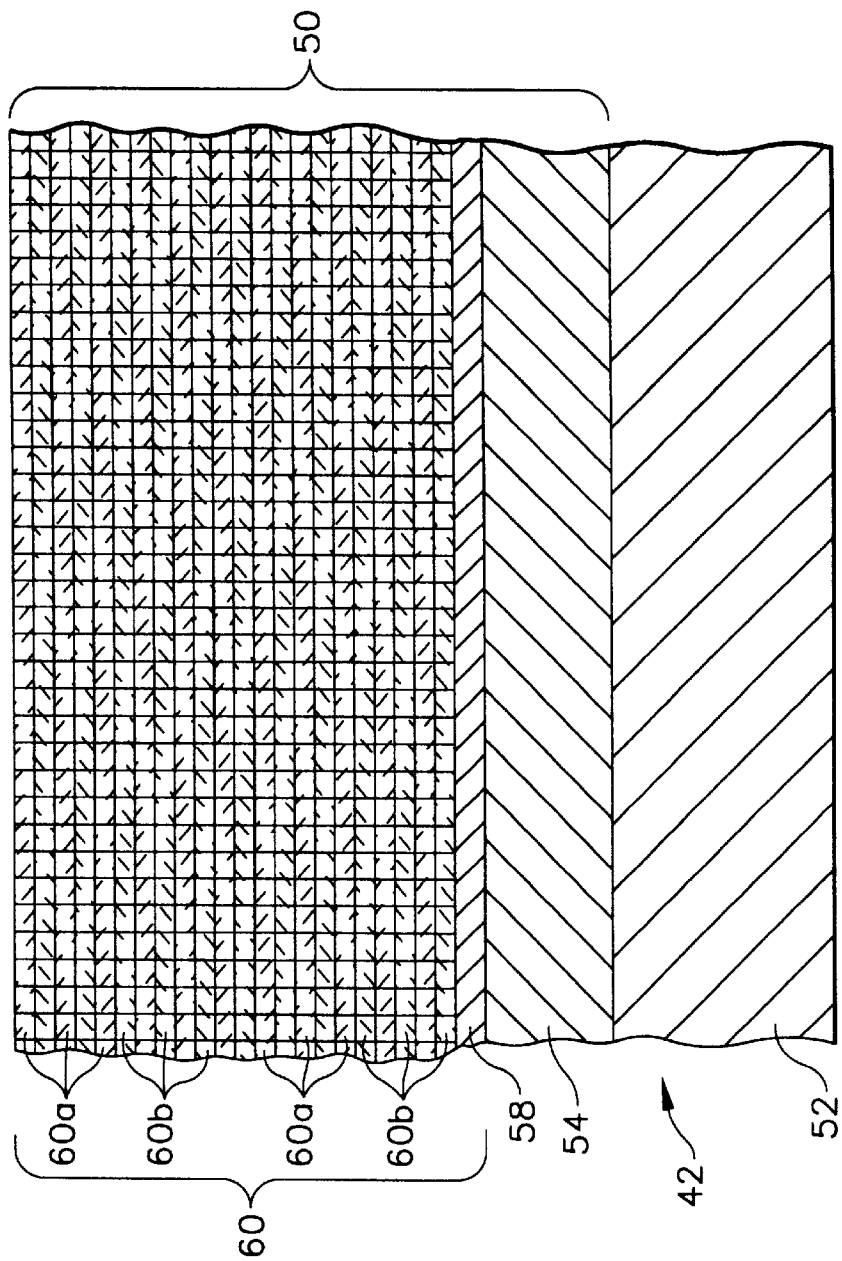
FIG. 2 is an enlarged sectional view of a turbine blade, and representing the surface structure of a multilayer thermal barrier coating system deposited on the blade by the method of this invention.

To illustrate the invention, an electron beam physical vapor deposition (EB-PVD) apparatus 10 is shown in FIG. 1. Shown supported within the apparatus 10 is a turbine blade 42 of a gas turbine engine. As is generally conventional, the blade 10 may be formed of a nickel-base or cobalt-base superalloy. The blade 42 includes an airfoil section against which hot combustion gases are directed during operation of the gas turbine engine, and whose surface is therefore subjected to severe attack by oxidation, corrosion and erosion. As shown in FIG. 2, an erosion-resistant thermal barrier coating system 50 is adherently formed on the surface of the blade 42 to protect its superalloy substrate 52 from the hostile environment of the turbine section. The coating system 50 is composed of a bond layer 54 over which a multilayer ceramic coating 60 is formed. As is also conventional, the bond layer 54 is preferably formed of a metallic oxidation-resistant material, such that the bond layer 54 protects the underlying substrate 52 from oxidation and enables the multilayer ceramic coating 60 to more tenaciously adhere to the substrate 52. A preferred bond layer 54 is formed by a cobalt or nickel-base alloy powder, such as NiCrAlY or an intermetallic nickel aluminide, which has been deposited on the surface of the substrate 52 to a thickness of about 25 to about 250 micrometers. Following deposition of the bond layer 54, an oxide layer 58 such as alumina may be formed at an elevated processing temperature to promote adhesion of the ceramic coating 60.

According to this invention, the ceramic coating 60 is composed of numerous discrete and homogeneous ceramic layers 60a and 60b of different ceramic materials characterized by differing thermal conductivities and resistance to erosion, such as alternating layers of about 6 to 8 weight percent yttria-stabilized zirconia and alumina, respectively. The presence of a ceramic material having a low thermal conductivity serves to render the blade 42 more resistant to a hostile thermal environment, while the presence of a ceramic material having a greater resistance to erosion promotes the service life of the coating system 50. Importantly, the apparatus 10 shown in FIG. 1 is adapted to sequentially deposit the desired multiple layers by physical vapor deposition in such a manner that the individual layers 60a and 60b are substantially homogeneous, and a distinct compositional interface is formed between the layers. As such, the thermal conductivity of the coating 60 is not increased as a result of intermixing of the ceramic materials, as has been the tendency with prior art attempts to deposit multiple layers of different ceramic materials. Furthermore, the apparatus 10 is adapted to rapidly deposit the multiple layers in a manner that maximizes the number of individual layers while minimizing the thickness of the ceramic coating 60. As a result, adhesion of the coating 60 to the substrate 52 is also promoted by this invention.

To achieve the above, the apparatus 10 is configured to house two or more ingots 24a and 24b of the ceramic materials intended to be deposited, and an electron beam gun 30 equipped with deflection plates 34 to appropriately deflect a beam 32 of electrons between the two ingots 24a and 24b. The deflection plates 34 can be of any type suitable for deflecting the electron beam 32, including known electrostatic and electromagnet devices. As is conventional, the apparatus 10 includes a vacuum chamber 12 capable of being maintained at a vacuum level of about $1\times10^{-3}$ Torr or less. A mechanical pump 14 and a diffusion pump 16 of types known in the art are employed to evacuate the chamber 12 during the deposition process.

As shown, the blade 42 is preferably secured to a rotatable support 18 and placed within the chamber 12 through a vacuum lock 20. Adjacent the vacuum lock 20 is a preheater 22 that can be used to preheat the blade 42 in order to clean and preheat its surfaces to an appropriate temperature for the deposition process. The preheater 22 may also be used to oxidize the bond layer 54 in order to form the alumina layer 58 that promotes adhesion of the ceramic materials subsequently deposited.

The ingots 24a and 24b are positioned within the chamber 12 such that the top of each ingot 24a and 24b is adjacent the surface of the blade 42, as shown in FIG. 1. A vacuum of about $1\times10^{-3}$ Torr or less is then drawn within the chamber 12. With the electron beam gun 30 positioned adjacent the top of the ingots 24a and 24b, the electron beam 32 emitted by the gun 30 can be selectively directed with the deflection plates 34 toward the upper surfaces 36a and 36b of the ingots 24a and 24b, respectively. In so doing, the upper surfaces 36a and 36b are melted by the energy of the electrons to form molten pools of the ceramic materials of the ingots 24a and 24b. Crucibles 38 can be used as shown to contain the molten pools of ceramic.

Intense heating of the ceramic materials by the electron beam 32 causes atoms of the ceramic materials to evaporate, travel upwardly, and then deposit on the surface of the blade 42. A heater 40 may be positioned above the blade 42 to provide additional heating as may be required to supplement the heat provided by the vaporized ceramic materials and the radiation from the top surfaces 36a and 36b of the ingots 24a and 24b. Together, the heater 40 and heat generated during evaporation of the ceramic materials serve to bring the blade 42 to a suitable deposition temperature of about 800 to about 1100° C. Under these conditions, the deposited ceramic layers have a columnar grain structure, in which the longitudinal axis of each grain is roughly perpendicular to the surface of the blade 42.

According to this invention, the evaporation process is further characterized by a deposition rate of five micrometers or more per minute. Such conditions are conducive to the particular deposition technique of this invention, in which the electron beam 32 is sequentially redirected between the ingots 24a and 24b at regular intervals. Specifically, the electron beam 32 can be rapidly cycled between the upper surfaces 36a and 36b of the ingots 24a and 24b in a manner that maintains a molten pool of ceramic material on each ingot 24a and 24b, while also avoiding the coexistence of ceramic vapors within the chamber 12 at any given moment. In so doing, the requirement to remelt the ingots 24a and 24b is avoided, as well as codeposition of the different ceramic materials which would undesirably result in a heterogeneous layer of ceramic materials being deposited between homogeneous regions of ceramic material.

According to the invention, a deposition cycle capable of achieving the above entails exposing each ingot 24a and 24b to the electron beam 32 for a duration of less than about three seconds, preferably less than about one second, with an interim period of up to about 100 milliseconds during which the electron beam 32 is traveling between ingots 24a and 24b. The result is a period of time in which the ingots 24a and 24b are not actively being evaporated. Surprisingly, a period of as little as about 0.001 to about 1 millisecond is adequate to ensure that vapors of both ceramic materials do not coexist within the chamber 12, and therefore do not codeposit on the blade 42. As such, a distinct compositional interface is formed between successive layers, such that the thermal and adhesion characteristics of the coating system are not degraded by intermixing of the ceramic materials. The preferred duration for which the electron beam 32 is directed at one of the ingots 24a and 24b, in combination with the preferred interim period during which the electron beam 32 is traveling between ingots 24a and 24b, is sufficient to both maintain a molten portion of the ingots 24a and 24b and deposit a discrete and homogeneous ceramic layer of less than about one micrometer, with ceramic layers of about 0.2 micrometer and less being readily and reliably attainable.

At the deposition conditions indicated above, a multilayer thermal barrier coating 60 composed of about 250 ceramic layers can be rapidly formed to yield a final thickness of about 50 micrometers or less for the barrier coating. Such a result is only advantageous if the resulting barrier coating 60 exhibits comparable thermal insulating properties and improved erosion and thermal cycle resistance as compared to conventional thermal barrier coating systems of the prior art. In accordance with this invention, a thermal barrier coating 60 having a thickness of about 50 micrometers and composed of 250 alternating layers of yttria-stabilized zirconia and alumina, each of which is discrete and homogeneous so as to avoid the presence of a mixed ceramic layer, exhibits both an increase in erosion resistance due to the presence of the alumina layers, as well as improved thermal resistance due to the lower thermal conductivity of the resulting multilayer coating 60. Therefore, a key aspect of this invention is the ability to employ high deposition rates of five micrometers per minute and higher while simultaneously depositing discrete and homogeneous ceramic layers, an accomplishment that was particularly unexpected.

The above deposition conditions advantageously illustrate the ability of the present invention to achieve a coating rate that approaches that for depositing a single ceramic material. Specifically, because an interim period of as little as about 0.010 millisecond is adequate to avoid the coexistence of ceramic vapors within the chamber 12, the efficiency of the coating process is only slightly reduced from that possible if the beam 32 were to remain on a single ingot during the entire coating process. Because a thinner coating system is possible with this invention, the actual time required for deposition of the coating 60 can be as much as 90 percent less than that required for conventional coating operations used to deposit a single ceramic material.

While our invention has been described in terms of a preferred embodiment, it is apparent that other forms could be adopted by one skilled in the art. Accordingly, the scope of our invention is to be limited only by the following claims.

What is claimed is:

1. A multilayer thermal barrier coating system on an airfoil, the multilayer thermal barrier coating system comprising a multilayer ceramic coating having successive layers of at least two different ceramic coating materials, one of the ceramic coating materials being characterized by a lower thermal conductivity than a second of the ceramic coating materials, the second of the ceramic coating materials being characterized by a greater resistance to erosion than the first of the ceramic coating materials, each of the successive layers being a discrete and homogeneous layer of one of the different ceramic coating materials such that a distinct compositional interface is formed between adjacent pairs of the successive layers, each of the successive layers having a columnar grain structure and a thickness of less than one micrometer.

2. A multilayer thermal barrier coating system as recited in claim 1, wherein the ceramic coating material characterized by a lower thermal conductivity is yttria-stabilized zirconia and the ceramic coating material characterized by a greater resistance to erosion is alumina.

3. A multilayer thermal barrier coating system as recited in claim 1, wherein the successive layers have approximately equal thicknesses.

4. A multilayer thermal barrier coating system as recited in claim 1, wherein the multilayer ceramic coating has a thickness of not more than about fifty micrometers.

5. A multilayer thermal barrier coating system as recited in claim 1, further comprising a bond coat that adheres the multilayer ceramic coating to the airfoil.

6. A multilayer thermal barrier coating system as recited in claim 5, further comprising an alumina layer between the bond coat and the multilayer ceramic coating.

7. A multilayer thermal barrier coating system as recited in claim 1, wherein the multilayer ceramic coating comprises more than two of the successive layers.

8. A multilayer thermal barrier coating system as recited in claim 1, wherein the multilayer ceramic coating comprises more than one hundred of the successive layers.

* * * * *